(12) United States Patent
Bernardi

(10) Patent No.: US 7,831,742 B2
(45) Date of Patent: Nov. 9, 2010

(54) METHOD AND DEVICE FOR ENUMERATION

(75) Inventor: Oreste Bernardi, Munich (DE)

(73) Assignee: Qimonda AG, Munich (DE)

(*) Notice: Subject to any disclaimer, the term of this patent is extended or adjusted under 35 U.S.C. 154(b) by 419 days.

(21) Appl. No.: 11/837,171

(22) Filed: Aug. 10, 2007

(65) Prior Publication Data
US 2009/0043932 A1 Feb. 12, 2009

(51) Int. Cl.
G06F 3/00 (2006.01)
G06F 13/12 (2006.01)

(52) U.S. Cl. ............................. 710/9; 710/62
(58) Field of Classification Search ........... 710/8–10, 710/15–19, 62–64, 72; 327/427; 711/212–214
See application file for complete search history.

(56) References Cited

U.S. PATENT DOCUMENTS

| 4,395,754 | A | * | 7/1983 | Feissel | 711/207 |
| 5,809,331 | A | * | 9/1998 | Staats et al. | 710/10 |
| 6,631,426 | B1 | * | 10/2003 | Staats | 710/9 |
| 7,123,497 | B2 | | 10/2006 | Matsui et al. | |
| 7,286,384 | B2 | | 10/2007 | Wendt et al. | |
| 7,356,619 | B2 | * | 4/2008 | Anderson et al. | 710/8 |

FOREIGN PATENT DOCUMENTS

| DE | 10 2004 020 038 A1 | 12/2004 |
| DE | 10 2004 007 233 B3 | 5/2005 |
| DE | 10 2004 021 089 A1 | 11/2005 |
| DE | 10 2005 011 369 A1 | 9/2006 |
| DE | 20 2006 017 615 U1 | 3/2007 |

OTHER PUBLICATIONS

"Controller Area Network," Wikipedia, the free encyclopedia, downloaded on Mar. 21, 2007, 7 pages, http://en.wikipedia.org/wiki/Controller_Area_Network.
"Controller Area Network—hardware description," CANWORKS, downloaded on Mar. 21, 2007, 8 pages, http://atlas.web.cern.ch/Atlas/GROUPS/DAQTRIG/DCS/CANINFO/canhard.htm.
"CAN Protocol Description," DCD-Digital Core Design, last updated Aug. 29, 2006, 6 pages, http://www.dcd.pl/ashow.php?page=can_protocol.
"Soft Configuration Enhances Flexibility of Handheld Computer Memory," The Museum of HP Calculators, 1984, 6 pages, http://www.hpmuseum.org/journals/71b.htm.

* cited by examiner

Primary Examiner—Christopher B Shin

(57) ABSTRACT

An embodiment of the invention describes a method for enumeration. The method includes assigning a second number to a device of a plurality of devices, wherein each device of the plurality of devices has a different unique first number. The method includes comparing at least portions of the first numbers and assigning a second number to one of the plurality of devices depending on the result of the comparison.

24 Claims, 11 Drawing Sheets

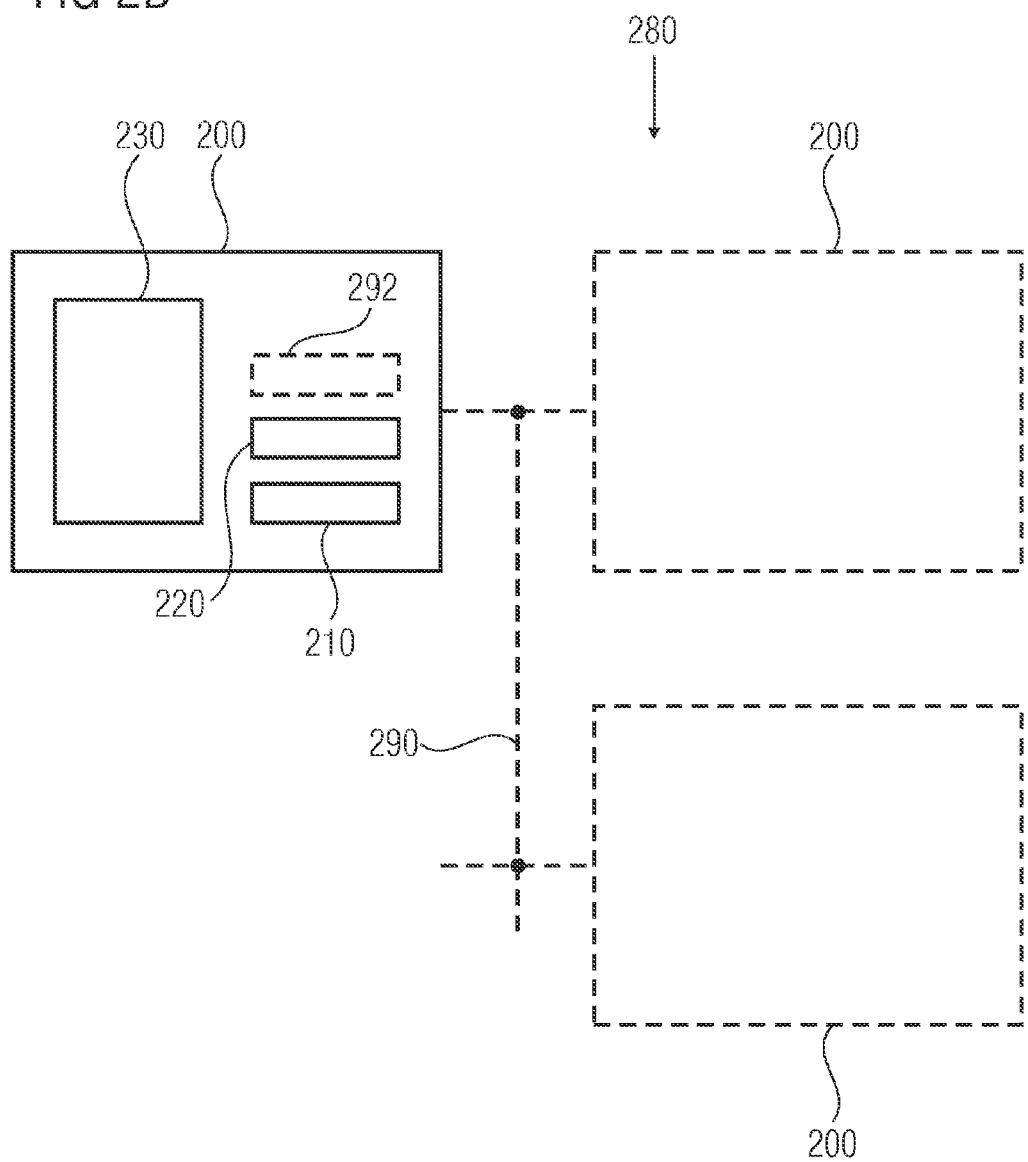

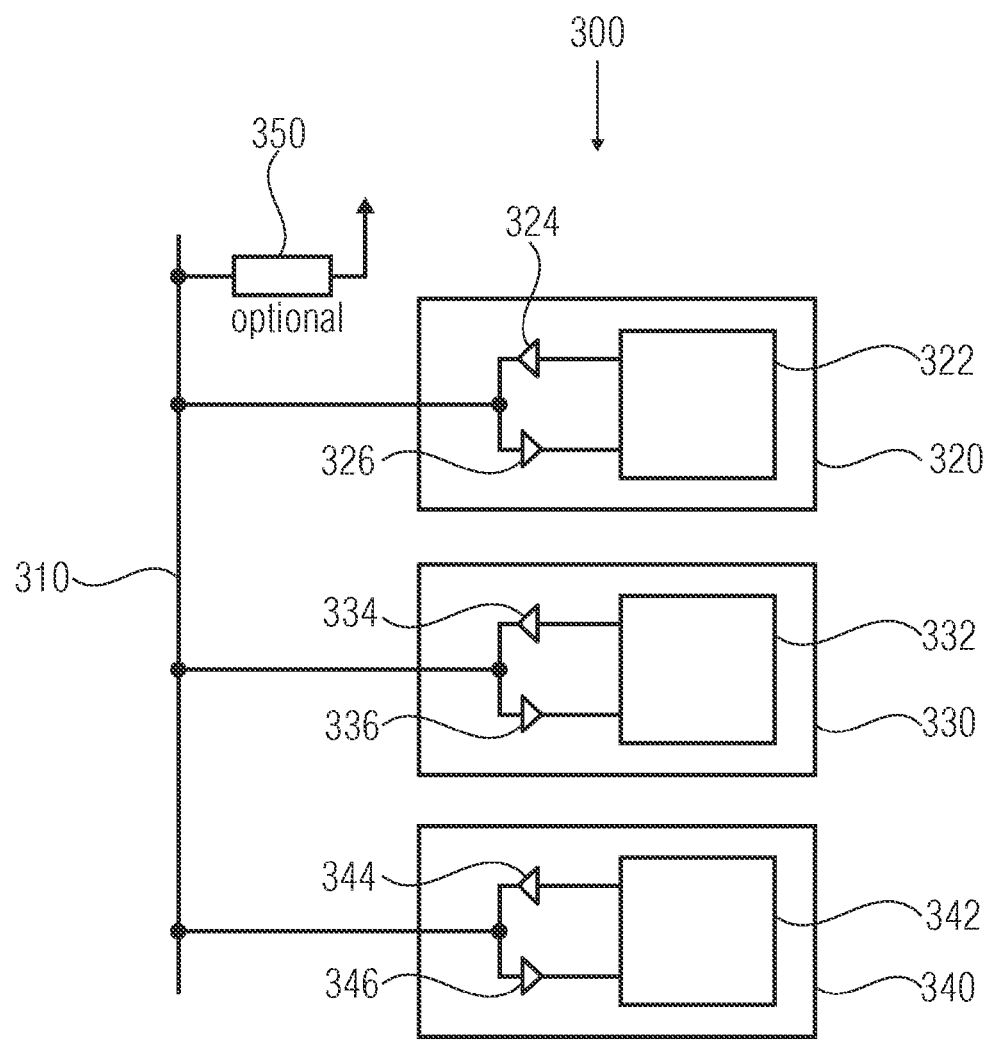

FIG 8

| | 810 | 820 | 830 | 840 | |
|---|---|---|---|---|---|
| | 1001 (=9) | 0111 (=7) | 1101 (=13) | 0011 (=3) | |
| 850 →: | counter=0 | counter=0 | counter=0 | counter=0 | state of signal line |
| 852 → Round 1: | 1 | 0 | 1 | 0 | 0 |
| 854 → | → counter+1 | | → counter+1 | | |
| 856 → | | 1 | | 0 | 0 |
| 858 → | | → counter+1 | | 1 | 1 |
| 860 → | | | | 1 | 1 |
| 862 → | | | | → finished | |
| Round 2: | 1 | 0 | 1 | | 0 |
| 866 → | → counter+1 | | → counter+1 | | |
| 868 → | | 1 | | | 1 |
| 870 → | | 1 | | | 1 |
| 872 → | | 1 | | | 1 |
| | | → finished | | | |
| 874 → Round 3: | 1 | | 1 | | 1 |
| 876 → | 0 | | 1 | | 0 |
| 878 → | | | → counter+1 | | |
| 880 → | 0 | | | | 0 |
| 882 → | 1 | | | | 1 |
| | → finished | | | | |
| 884 → Round 4: | | | 1 | | 1 |
| 886 → | | | 1 | | 1 |
| 888 → | | | 0 | | 0 |
| 890 → | | | 1 | | 1 |
| | | | → finished | | |
| counter | 10 (=2) | 01 (=1) | 11 (=3) | 00 (=0) | |

METHOD AND DEVICE FOR ENUMERATION

BACKGROUND

Electrical systems may comprise a plurality of individual devices, such as chips or integrated circuit chips. The functionality of an electronic system is based on establishing and maintaining a communication among the devices and to external components. Such communications may use individual addresses for the devices.

BRIEF DESCRIPTION OF THE DRAWINGS

Embodiments of the invention are described hereinafter, making reference to the appended drawings.

FIG. 2b shows a block schematic diagram of a system, according to an embodiment of the invention;

FIG. 3 shows a block schematic diagram of a circuit arrangement for implementing a wired-AND-operation;

FIG. 8 shows a graphical representation of exemplary steps and corresponding signals and intermediate results, which may occur during the parallel execution of the method of FIG. 7 in four devices;

DETAILED DESCRIPTION OF ILLUSTRATIVE EMBODIMENTS

In the following description, for purposes of explanation and not limitation, specific details are set forth such as particular structures, implementations, components, techniques, etc. in order to provide a thorough understanding of the various aspects of embodiments according to the invention. However, it will be apparent to those skilled in the art having the benefit of the disclosure that various aspects of embodiments of the invention may be practiced in other examples that depart from these specific details. In certain instances, descriptions of well known devices, circuits and methods are omitted so as not to obscure the description of embodiments of the invention with unnecessary detail.

In electronic systems, individual devices may be coupled to each other to facilitate a communication between the devices and between the devices and external components. To establish and to maintain a communication in such systems it may be necessary to individually address the devices to achieve a desired functionality.

Due to the growing complexity of such systems, it may become more and more difficult to realize a communication based on separate signal lines to control the individual devices. As a consequence, the devices may be addressed based on address values and commands, which requires the devices to be unambiguously addressable.

Such an approach may be implemented in a memory subsystem, like a memory module or a multi-chip package (MCP), also referred to as a multi-chip device. Such a memory subsystem may comprise a plurality of devices, generally referred to as chips, dice or integrated circuits (ICs).

In multi-chip flash devices, it may be difficult to provide each chip with a separate electrical signal line which may carry a respective chip enable signal. Thus, it may not be possible to select a single chip using an individual electrical signal, such as a separate chip enable signal. Chips may be coupled in parallel to a control signal line and may be selectable by using commands and/or addressing signals that will be recognized by the chips. In the case of a NAND flash memory, an individual chip of a multi-chip package can be selected by the last bit or the last bits of the last address cycle.

Thus, there may be a need for each device to be individually addressable. A unique address that differs from the addresses of all the other devices in the same multi-chip package or system may be associated with each device. Therefore, a demand may exist to establish an efficient method of assigning unique ID numbers to the individual devices to address the devices individually.

Figure 1:
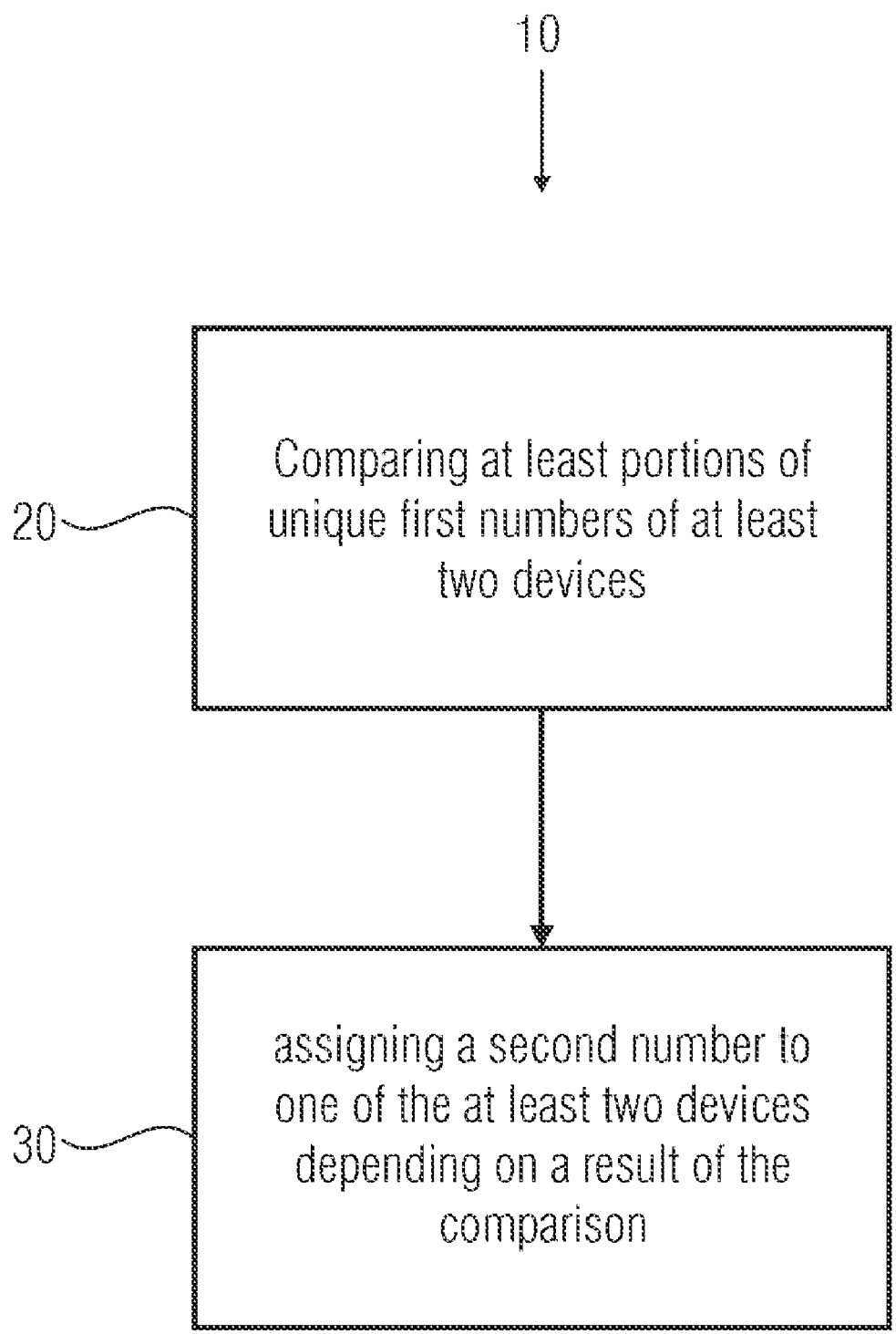
FIG. 1 shows a flow chart of a method for enumerating devices, according to an embodiment of the invention.

FIG. 1 shows a flow chart of a method 10 for enumeration by assigning a second number to a device of a plurality of devices, each device of the plurality of devices having a different unique first number. The method 10 comprises a first step 20 of comparing at least portions of unique first numbers of at least two devices. Moreover, the method 10 comprises a second step 30 of assigning a second number to one of the at least two devices depending on a result of the comparison.

In other words, according to an embodiment of the invention, a method for enumeration by assigning a second number to a device of a plurality of devices, wherein each device of the plurality of devices has a different unique first number, comprises comparing at least portions of the first number and assigning a second number to one of the plurality of devices, depending on the result of the comparison.

The second number may be employed as an address or an address value, for instance, indicating at least a portion of the address space (e.g., the most significant bits, if applicable) of a corresponding device in the system.

Embodiments of the invention may allow for assigning second numbers to devices in an efficient, flexible and unambiguous manner.

In embodiments of the invention, the comparison of at least portions of the first numbers reveals an order of the first numbers, and the second numbers are assigned to the second devices according to the revealed order. In embodiments of the invention, the second numbers are assigned in an ascending or descending order of the first numbers.

In embodiments of the invention, the comparison is achieved by comparing portions of the first numbers, wherein a device will pass a comparison if the compared portion fulfills a predetermined condition. Devices passing the comparison may participate in a subsequent comparison, in which a different portion of the first numbers is compared. Devices not passing the comparison will not participate in the subsequent comparison. Subsequent comparisons may be repeated until a single device remains due to the unique first numbers. The second number may be assigned to the remaining device.

This procedure may be repeated until all devices have been assigned a second number, wherein devices that have been assigned a second number no longer participate.

In embodiments of the invention, the predetermined condition may be that the compared portion comprises a predetermined value. In embodiments of the invention, the condition may be that the portion comprises a value corresponding to a state of a recessive/dominant signal line.

In embodiments of the invention, the comparison comprises a bit-wise comparison of the first numbers, starting with the least significant bit or the most significant bit thereof.

In embodiments of the invention, the first numbers of different devices may be assigned to, associated with or stored in an appropriate storage position of the devices at some stage before the start of the comparison. The first numbers may comprise at least one of a device-specific number, a serial number, an identifier indicative of the type of the device, an identifier indicative of the manufacturer of the device, a wafer number on which the specific device was comprised, a position of the device on the wafer, a random number, a pseudo-random number, and a predetermined or fixed number. First numbers associated with the devices in a system may be considered to be unique numbers when two numbers associated with two different devices are different from one another with a sufficiently high probability. In other words, two numbers or portions of two numbers are considered to be unique when the possibility of two numbers being equal is sufficiently low, for instance, below a predetermined, fixed threshold value, such as $10^{-s}$, wherein s is a positive integer (e.g., s=4, 6, 8, 12, 16, 20, 50 or 100).

In embodiments of the invention, unique ID numbers stored at a wafer sorting level may be used as the first numbers, such that each time the method is applied the identical association between second numbers and devices is obtained. In embodiments of the invention, a random number generator or a pseudo-random number generator may be used to generate the first numbers each time the method is applied, so that the association between second numbers and devices will vary depending on the generated random or pseudo-random numbers.

In embodiments of the invention, the second numbers assigned to the devices may be shorter than the first numbers associated with different devices. In embodiments of the invention, the second numbers may be used to address the devices, so that the second number may comprise a minimum length required to enable different second numbers to be assigned to each of the devices of the plurality of devices. That is, in embodiments of the invention, exactly the minimum number of binary digits, also referred to as bits, for the second number of the devices may be used. For instance, in the case of a multi-chip package comprising 16 devices, such as a die stack comprising 16 dice, in principle only 4 bits are required to assign to each of the 16 dice an individual, in terms of the die stack, unique ID number as the second number.

Embodiments of the invention may be implemented using already existing hardware structures, such as pads or terminals for data exchange and other components such as registers and comparators.

In embodiments of the invention, enumeration may be obtained using a signal line, which already exists in the system. The signal line may be used for the communication required in conducting the enumeration. Upon completion of the enumeration, the signal line can be used for standard activities during normal mode of operation. In such embodiments, implementation of an additional pad or terminal is not required.

In embodiments of the invention, the signal line is capable of acquiring different states comprising at least a first state and a second state. The signal line may comprise the first state when at least one signal provided to the signal line corresponds to the first state. The signal line may comprise the second state only when all signals provided to the signal line correspond to the second state. Such signal line architecture is also referred to as a dominant/recessive signal line architecture, wherein the second state is called the recessive state and the first state is referred to as the dominant state. In embodiments of the invention, comparing the at least portions of the first numbers may include providing signals indicative of the at least portions of the first numbers to the signal line and detecting the state of the signal line. When the detected state and the provided signal do not match, the comparison is not passed. Otherwise, the comparison is passed.

Embodiments of the invention may comprise NAND flash memory devices, wherein the so-called ready/busy signal line (R/B signal line) can be used as the signal line for performing the comparison, without adding any extra pads or terminals and without affecting the performance during normal mode of operation.

In embodiments of the invention, the devices of a system, such as a multi-chip package, may be adapted to perform the method substantially self-sufficiently so that any external support by means of an external host, such as a memory controller, can be minimal, if any. In embodiments, the host may only start and/or stop the self-enumeration resulting in an excellent backward compatibility. Embodiments of the invention can be implemented without altering an external control system.

Figure 2A:
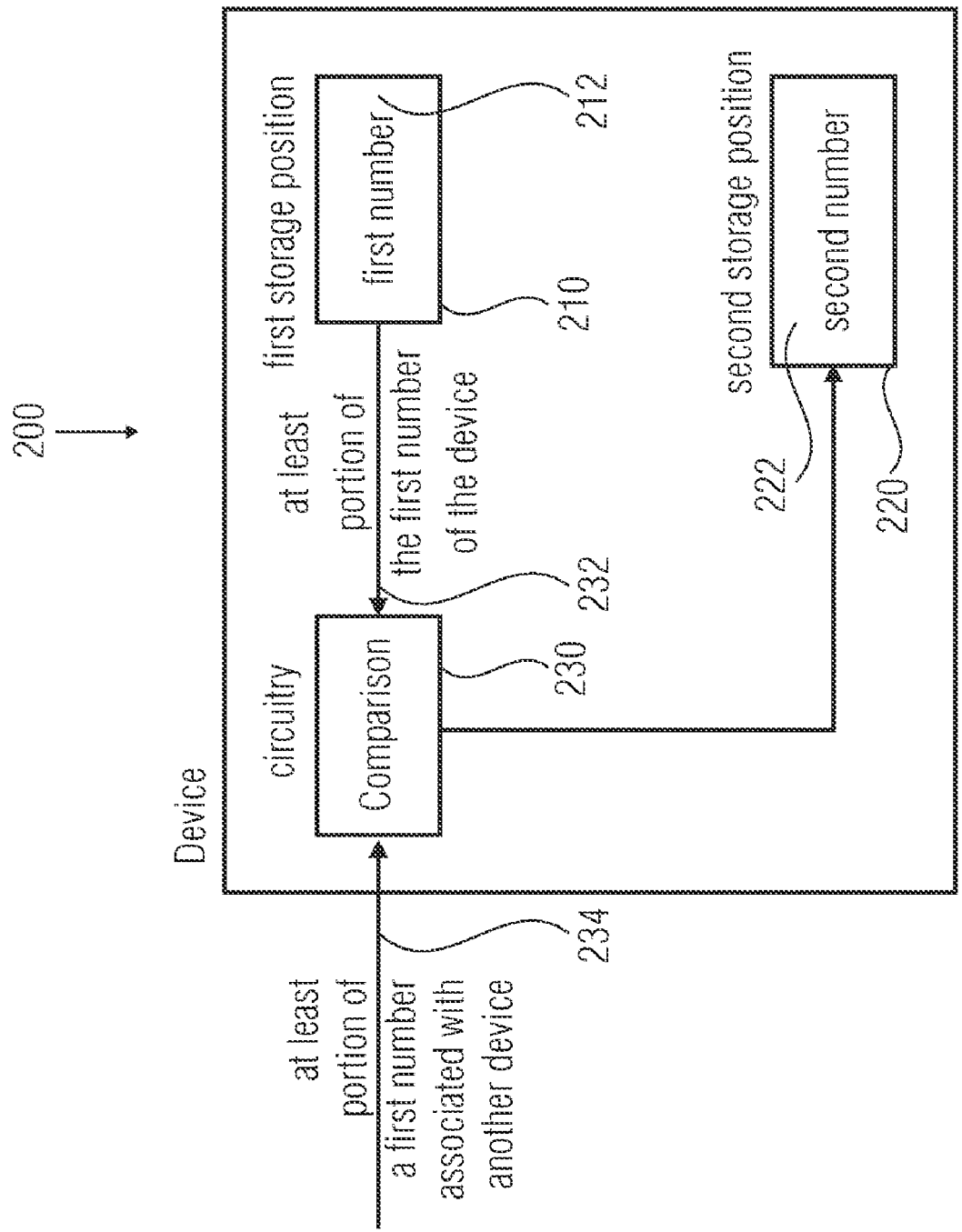
FIG. 2a shows a block schematic diagram of a device, according to an embodiment of the invention.

FIG. 2a shows a block schematic diagram of a device, according to an embodiment of the invention. The device of FIG. 2a is designated in its entirety with 200. The device 200 comprises a first storage position 210 capable of storing a first number 212. The device 200 comprises a second storage position 220 capable of storing a second number 222. Moreover, the device 200 comprises a circuitry 230 which is coupled to the first storage position 210 to receive from the first storage position 210 at least a portion 232 of the first number 212 of the device 200. The circuitry 230 is also adapted to receive at least a portion 234 of the first number associated with another device (not shown here).

The circuitry 230 is coupled to the second storage position 220, and is adapted to compare at least a portion of the first number 212 stored in the first storage position 210 with at least a portion of the different first number associated with the other device. In addition, the circuitry 230 is adapted to assign the second number 222 to the device 200 based on the result of the comparison.

In an embodiment, the circuitry 230 may, for example, be adapted to receive from the first storage position 210 at least a portion of the first number 212. In another embodiment, the circuitry 230 may receive the complete first number 212. In addition, the circuitry 230 may, for example, be adapted to receive, for example from another device, a portion of a first number associated with the other device, or the complete first number associated with the other device. The circuitry 230 may further compare, depending on the actual implementation, the portions of the first numbers of the present device and of another device, or the complete first numbers of the devices. Depending on the result of the comparison, the circuitry 230 may provide information to the second storage position 220 to store the second number 222 in the second storage position 220.

The device 200 allows for an efficient assignment of the second number 222 to the device 200. According to an embodiment, a quantitative relationship between the first number 212 associated with the device 200 and another first number associated with another device can be evaluated in order to determine the second number 222 of the device 200.

Thus, when the device 200 is operated in combination with the other device, the second number 222 assigned to the device 200 is not chosen arbitrarily or independently from any other devices, but in dependence on the first number (or a portion thereof) associated with the other device. Consequently, the second number 222 may define a relationship between the device 200 and the other device and may further be used for addressing. In addition, if the other device (not shown) comprises the same means as the device 200 (e.g., a first storage position comparable to the first storage position 210 of the device 200, a circuitry comparable to the circuitry 230 of the device 200, and a second storage position comparable to the second storage position 220 of the device 200), different second numbers may be assigned to the device 200 and the other device. In such a case, the second numbers associated with the device 200 and the other device may be used for identifying or addressing the devices.

However, it should be noted that the present invention does not require the presence of two structurally identical devices (having different first numbers). Rather, it is sufficient to have a single device 200, if, for example, the device 200 is able to obtain the first number 234 (or a portion thereof) from another device.

Different types of memory may be used for storing the first number 212 and the second number 222. In an embodiment, the first storage position 210 may comprise a read only memory. In other embodiments, the first storage position 210 may be implemented as a write-once-read-multiple (WORM) memory or as a rewritable memory. The first storage position 210 may be implemented as a volatile or non-volatile memory, depending on certain implementation requirements.

The second storage position 220 may, for example, be implemented as a write-once-read-multiple (WORM) memory or as a rewritable memory. In some embodiments, a random access memory structure may be used to implement the second storage position 220. Generally speaking, both volatile and non-volatile memory structures can be used to implement the second storage position 220.

FIG. 2b shows a block diagram of an embodiment of the invention in the form of a system 280 comprising two or more devices 200. Same means or signals have been designated with same reference numerals in FIGS. 2a and 2b. Each of the devices 200 comprises a first storage position 210, a second storage position 220 and a circuitry 230. The first storage position 210 is capable of storing a first number of the device and the second storage position 220 is capable of storing a second number of the respective device 200. These storage positions may be implemented in different memories or in the same memory. The storage positions may be implemented using different memory technologies. The first storage position 210 may be implemented as a read-only memory (ROM), a write-once-read-multiple (WORM) memory, a non-volatile memory or a volatile memory, such as a random access memory (RAM). The second storage position 220 may be implemented using the same memory technologies, except for the ROM technology. A WORM memory storage position may, for instance, be a fuse-based storage position, whereas a non-volatile storage position may, for instance, be based on a flash memory technique.

The different devices 200 are electrically coupled to each other via at least one signal line 290.

The devices 200 may be capable of transmitting the first numbers or portions of the first numbers stored in the first storage position 210 over the signal line 290. The devices 200 may be capable of receiving and optionally storing the received first numbers (or the portions thereof). The circuitry 230 may be capable of performing a comparison of the first numbers. Moreover, each of the circuitries 230 may be adapted to assign a respective second number to the associated device. The second number may be stored in the respective second storage position 220.

The comparison may be based on comparing single bits, nibbles (4 bits), bytes (8 bits), words (typically 16, 32, 48 or 64 bits) or another number of bits or binary digits.

In an embodiment of the invention, the circuitries 230 of the devices 200 may simply compare the first numbers to each other and assign the second numbers accordingly. To be more specific, the circuitries 230 may determine an order of the devices 200 based on the first numbers and assign the second numbers accordingly.

In an embodiment of the invention, each circuitry 230 is adapted to compare a portion of the first number of the associated device 200 with corresponding portions of the first numbers of the other devices by determining whether the portion of the first number meets a condition. If the portion of the first number meets the condition, the associated device passes the comparison and participates in a subsequent comparison of a next different portion of the first numbers. This procedure may be repeated with respectively different portions of the first numbers until a single device remains. The second number may be assigned to the remaining device. Then, the whole procedure of assigning a second number to one of the devices (one round) may be repeated (without those devices to which a second number has already been assigned) until all devices have been assigned a second number.

In embodiments of the invention, the second number may correspond to the number of rounds in which the associated device participated. In embodiments of the invention, the device 200 may comprise a counter 292 to count the number of rounds. The second number may then simply be based on the count of the counter 292.

In embodiments of the invention, the circuitry 230 of the device 200 that has won the last round, i.e., to which a second number has been assigned in the last round, may provide a restart signal to those devices 200, to which a second number has not been assigned yet, to restart the next round. In embodiments of the invention, the condition, to which the respective portion of the first number is compared, may be the state of a dominant/recessive signal line. Thus, the signal line 290 may connect the devices 200 in a dominant/recessive signal line architecture. If the dominant signal bit is equal to 0 (low, L), the signal line architecture is also called a "wired-and architecture" as a single signal 0 will drive the signal line 290 to 0. If the dominant bit is 1, the signal line architecture is called a "wired-or architecture."

In the following, embodiments of the invention are described in connection with a self-enumeration of chips in a multi-chip package utilizing a dominant and recessive signal line architecture. Embodiments of the invention are described referring to the NAND flash technology, wherein the R/B signal line (ready/busy signal line) already existing in this technology is operated as a dominant/recessive signal line.

In the following, a possible mechanism for comparing two numbers (or portions thereof) will be described, which can be used in some embodiments of the invention in order to compare two or more numbers (or portions thereof).

This concept is based on performing one or more wired-AND-operations or wired-OR-operations using a "common" signal line connected to a plurality of drivers. In order to facilitate the understanding of the concept, several hardware structures will firstly be described with reference to FIGS. 3-6, which can be used to implement a wired-AND-operation or a wired-OR-operation.

FIG. 3 shows a block schematic diagram of a device arrangement for implementing a wired-AND-operation or a wired-OR-operation. The device arrangement of FIG. 3 is designated in its entirety with 300. The device arrangement 300 comprises a common signal line 310 and, for example, three devices 320, 330, 340 coupled to the common signal line 310. Each of the devices 320, 330, 340 comprises a corresponding control circuitry 322, 332, 342, a corresponding driver 324, 334, 344, and a corresponding receiver or input buffer 326, 336, 346.

In the following, the first device 320 will be described in more detail, but the description also applies to the second device 330 and the third device 340. The driver 324 is circuited between an output of the control circuitry 322 and the common signal line 310. The driver 324 is, for example, configured to drive the signal line 310 to a dominant value (e.g., to a dominant electrical level) or to a recessive value (e.g., to a recessive electrical level) depending on data to be output from the control circuitry 320 to the common signal line 310. The driver 324 may, for example, be configured to apply a big driver strength when driving the common signal line 310 to the dominant value. It may further be configured to apply a small driver strength when driving the common signal line 310 to a recessive value. For example, the driver 324 may have a first current drive capability to drive the common signal line 310 to the dominant value, and a second current drive capability to drive the common signal line 310 to the recessive value, wherein the second current drive capability is larger than the first current drive capability.

Alternatively, the driver 324 may be configured to drive the common signal line 310 to the dominant value and to leave the common signal line 310 open when it is desired to output the recessive value to the common signal line 310.

The receiver 326 may, for example, be configured to receive an actual value, which is present on the common signal line 310, and to provide information about the actual value, which is present on the common signal line 310, to the control circuitry 322.

It should be noted that the actual value present on the common signal line 310 may be different from the value output or provided to the common signal line 310 by the driver 324. For example, if the driver 324 of the first device outputs the recessive value to the common signal line 310, a driver 334, 344 of another device 330, 340 may output the dominant value to the common signal line 310. In this case, the common signal line 310 may still take the dominant value, and the receiver 326 may therefore receive a value that is different from the value output to the common signal line by the driver 324.

To summarize the above, it can be stated that the common signal line 310 may take the dominant value, whenever at least one of the devices 320, 330, 340 connected to the common line 310 outputs the dominant value to the common signal line 310. In an embodiment, the common signal line 310 only takes the recessive value if all of the devices 320, 330, 340 connected to the common signal line 310 output the recessive value to the common signal line 310, or have deactivated their respective drivers 324, 334, 344.

In one embodiment, the common signal line 310 may be configured to carry the recessive value if neither of the devices connected to the common signal line 310 outputs the dominant value by a bias element 350. The bias element 350 may, for example, comprise a resistor.

Figure 4:
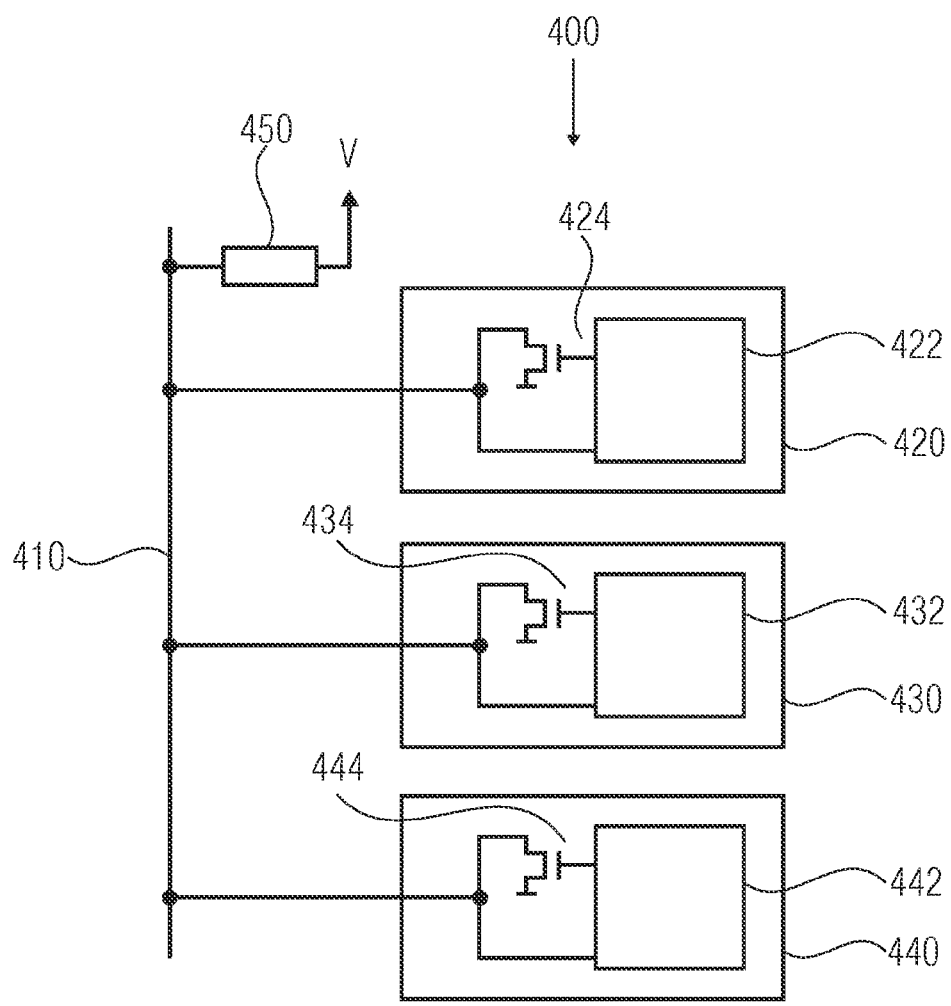
FIG. 4 shows a block schematic diagram of a circuit arrangement for implementing a wired-AND-operation.

FIG. 4 shows a block schematic diagram of a circuit arrangement implementing a wired-AND-operation making use of a common signal line. The circuit arrangement of FIG. 4 is designated in its entirety with 400. The circuit arrangement 400 comprises a common signal line 410, which is coupled to three circuit blocks or devices 420, 430, 440. Moreover, the common signal line 410 is, for example, coupled to a supply potential V via a resistor 450. The supply potential V may, for example, be positive with respect to a reference potential GND. The devices 420, 430, 440 coupled to the common signal line 410 comprise respective control circuitries 422, 432, 442. Moreover, the devices 420, 430, 440 comprise, as a driver, corresponding NMOS field effect transistors 424, 434, 444 operated in an open drain configuration. With reference to the first device 420, a source-terminal of the NMOS field effect transistor 424 is coupled to the reference potential GND. A drain gate-terminal of the NMOS field effect transistor 424 is coupled to an output of the control circuitry 422 and a drain-terminal of the NMOS field effect transistor 424 is coupled to the common signal line 410. Similar configurations apply to the other devices 430, 440 as can be seen from FIG. 4. Moreover, the signal level present at the common signal line 410 is sensed by the respective control circuitries 422, 432, 442 (e.g., using a signal receiver or input buffer).

Regarding the functionality, it is assumed that the resistor 450 is large enough, such that the common signal line 410 can be driven to a potential close to the reference potential GND by the activation of a single one of the NMOS field effect transistors 424, 434, 444. Thus, if at least one of the NMOS field effect transistors 424, 434, 444 is activated, or switched on, the potential of the common signal line 410 is pulled to a level close to the reference potential GND. Only if all the NMOS field effect transistors 424, 434, 444 are deactivated, or switched off, is the level on the common signal line 410 pulled to a value close to the supply potential VCC by the resistor 450.

Figure 5:
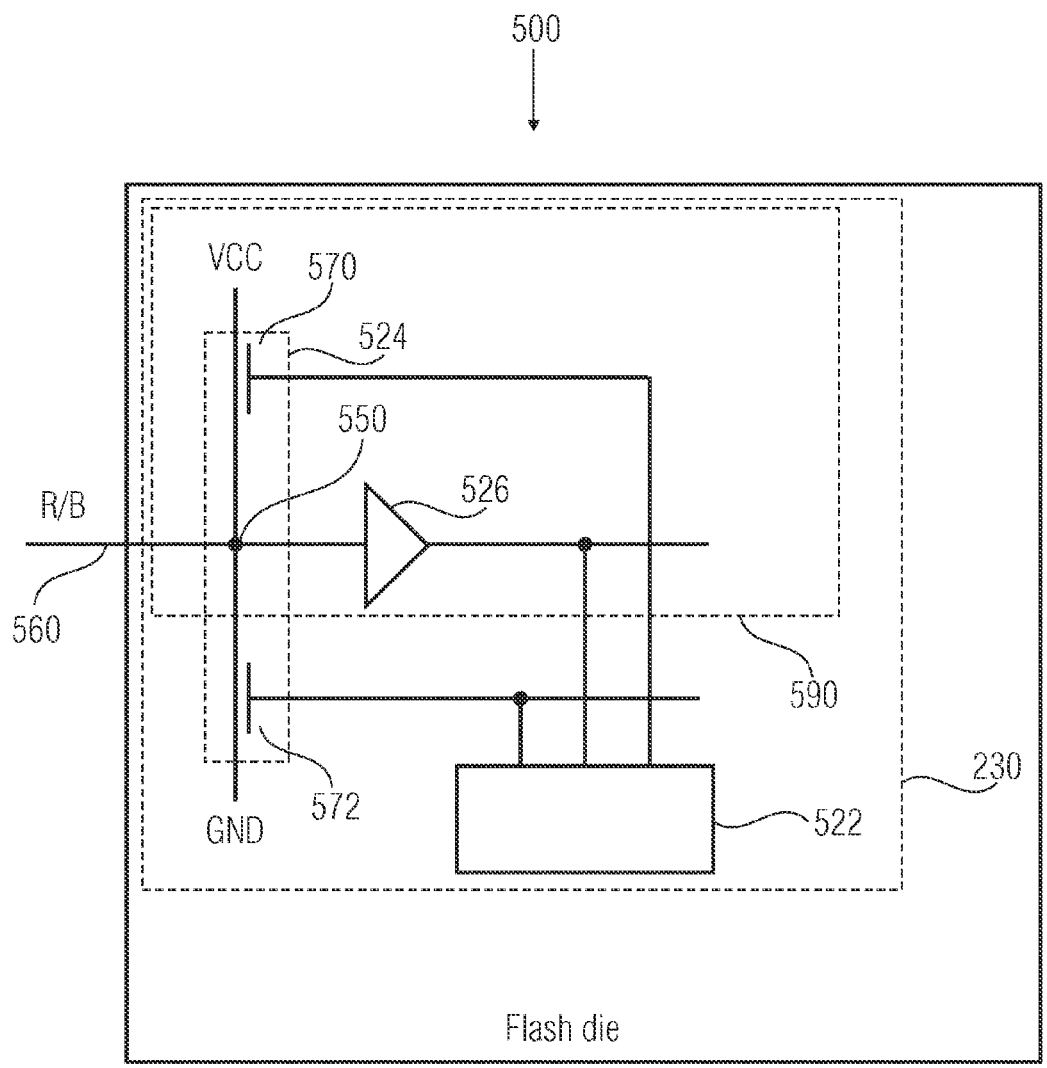
FIG. 5 shows a block schematic diagram of a device, according to an embodiment of the invention.

FIG. 5 shows a block schematic diagram of a device according to an embodiment of the invention. The device of FIG. 5 is designated in its entirety with 500. The device 500 comprises a control circuit 522, a driver circuit 524 and a receiver circuit or input buffer 526. The driver circuit 524 is configured to pull a coupling node 550, which can be coupled to a common signal line (e.g., to a ready/busy line) 560, towards a reference potential GND or towards a supply potential VCC.

For the sake of explanation, a potential which is close to the reference potential GND (or closer to the reference potential GND than to the supply potential VCC) will be considered in the following to represent a dominant value. A potential close to the supply potential VCC (or closer to the supply potential VCC than to the reference potential GND) will be considered in the following to represent a recessive value. However, other definitions of the dominant and the recessive potentials are possible and are well within the scope of the invention.

The driver circuit 524 comprises a recessive value driver 570 and a dominant value driver 572. The recessive value driver 570 may, for example, comprise a transistor (e.g., a PMOS field effect transistor) circuited between the supply potential VCC and the coupling node 550.

An input terminal or control terminal of the recessive value driver 570 may, for example, be coupled to the control circuit 522.

The dominant value driver 572 may, for example, comprise a transistor (e.g., a NMOS field effect transistor) circuited between the reference potential GND and the coupling node 550. An input terminal or control terminal of the recessive value driver 572 may, for example, be coupled with the control circuit 522.

Moreover, in an embodiment, the dominant value driver 572 may be configured to provide a larger current in a switched-on state than the recessive value driver 570. In an embodiment, the dominant value driver 572 may even be configured to provide, in an on-state, a current which is larger than two times a current provided by the recessive value driver 570 in the on state.

In an embodiment, the transistor of the recessive value driver 570 circuited between the coupling node 550 and the supply potential VCC may be a small transistor, for example, "smaller" than the transistor of the dominant value driver 572 circuited between the reference potential GND and the coupling node 550. For example, in the case of field effect transistors, an effective channel width of the transistor of the recessive value driver 570 may be smaller than an effective channel width of the transistor of the dominant value driver 572.

Naturally, the recessive value driver 570 and the dominant value driver 572 may also comprise bipolar transistors circuited between the coupling node 550 and the reference potential GND or the supply potential VCC.

The control circuit 522 may, for example, be configured to provide inverse control signals to the input terminals or control terminals of the recessive value driver 570 and the dominant value driver 572. For example, the control circuit 522 may be configured to activate (i.e., to switch on) the recessive value driver 570 when the dominant value driver 572 is deactivated (i.e., switched off). The control circuit 522 may further be configured to deactivate the recessive value driver 570 when the dominant value driver 572 is activated. In this mode of operation, either the recessive value driver 570 or the dominant value driver 572 is activated. Thus, the coupling node 550 is either pulled towards the supply potential VCC via the recessive value driver 570 or pulled towards the reference value GND via the dominant value driver 572. However, there may, optionally, be a state of operation in which both the recessive value driver 570 and the dominant value driver 572 are deactivated. In this case, the driver circuit 524 "releases" the coupling node 550 (i.e., neither pulls the coupling node 550 towards the supply potential VCC nor towards the reference potential GND). In other words, the driver circuit 524 leaves the coupling node 550 floating provided parasitic effects are neglected. Naturally, the potential of the coupling node 550 can in this state be affected by other devices coupled to the coupling node 550, e.g., by circuits external to the device 500.

The receiver circuit 526 is configured to receive a potential from the coupling node 550 and to provide an output value to the control circuit 522 on the basis of the potential of the coupling node 550. The signal provided by the receiver circuit 526 may be considered to be a R/B readout signal.

It should be noted here that there may also be other modes of operation. For example, there may be a mode of operation in which the recessive value driver 570 is deactivated, while the input terminal or control terminal of the dominant value driver 572 is connected to a ready/busy signal. In this way, the dominant value driver 572 may be reused to provide a ready/busy signal to the common signal line 560. In this way, the common signal line 560 may be reused both for a device enumeration and for a transmission of a ready/busy state. However, while in an embodiment only the dominant value driver 572 may be used for driving the ready/busy state to the common signal line 560, both the recessive value driver 570 and the dominant value driver 572 may be used for device enumeration, as will be described in more detail in the following.

It should be noted here that a transistor circuited between the supply potential VCC and the coupling node 550 in the recessive value driver 570 may be considered as a "bit 1 transistor" for driving a recessive bit (bit 1). Moreover, a transistor circuited between the reference potential GND and the coupling node 550 may be considered to be a "bit 0 transistor" for driving the dominant bit of the ready/busy signal (R/B signal). Moreover, it should be noted that the device 500 may, for example, be implemented on a flash die. However the device 500 can naturally be implemented on other integrated circuits or in combination with other circuits or memory technologies.

In the following, it will be assumed that a plurality of devices 500 (i.e., at least two devices 500) are coupled to a common signal line 310. For example, three devices 320, 330 and 340 or at least two of the devices 320, 330, 340 may be replaced by a corresponding device 500. In the following, a possible signal, which may be present on the common signal line 310 (also designated as an "arbitration line") in an embodiment of the invention will be described with reference to FIG. 6.

Figure 6:
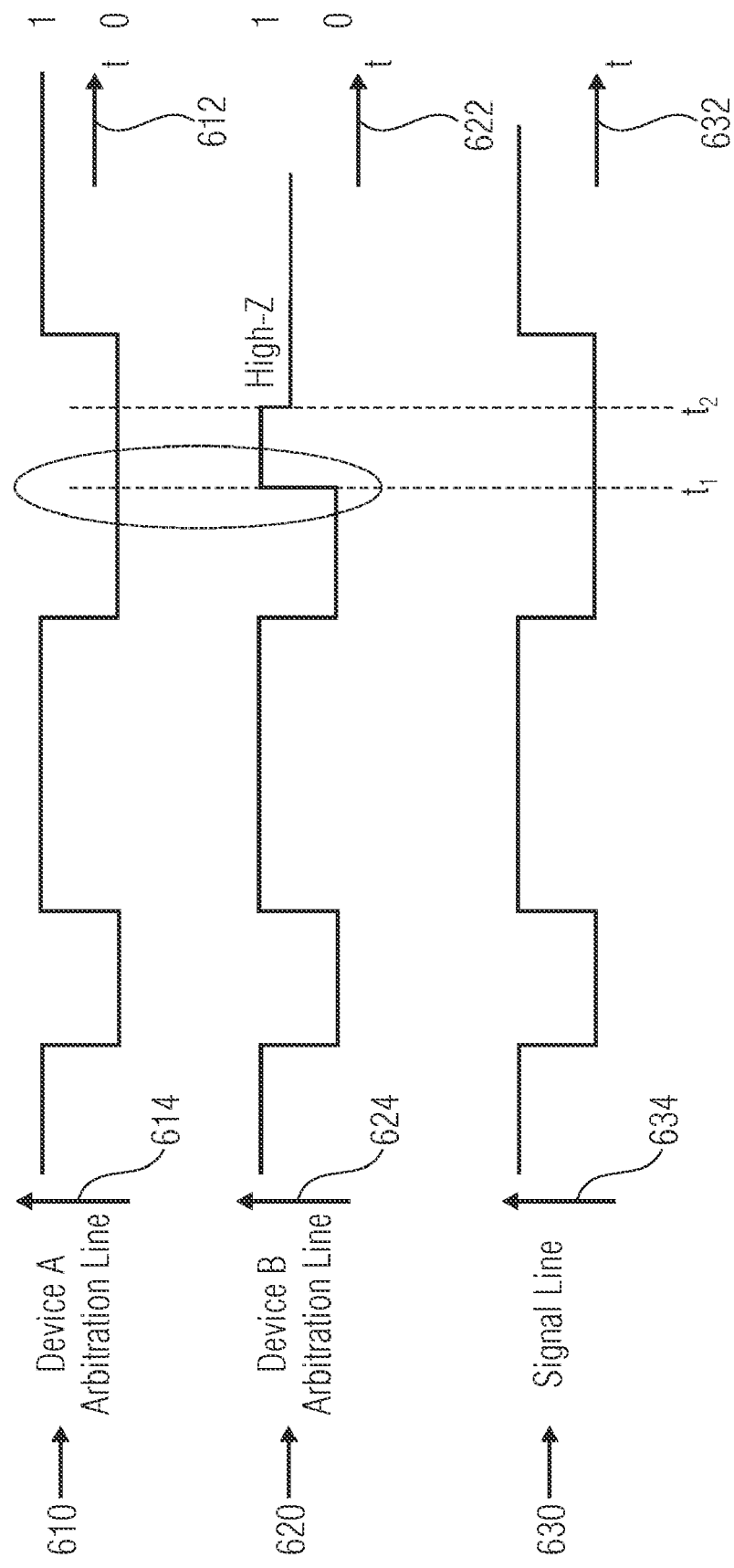
FIG. 6 shows a graphic representation of signals, which may be present in an embodiment of the invention.

FIG. 6 shows a graphic representation of signals. A first graphic representation 610 shows a signal to be driven to the common signal line 310 by the first device 320. An abscissa 612 describes the time, and an ordinate 614 describes the signal value to be output or driven to the common signal line by the driver 324 (which may be implemented by a driver 524, as shown in FIG. 5). The signal shown in the first graphic representation 610 may be provided by the control circuit 322 (which may be implemented by the control circuit 522 shown in FIG. 5). A second graphic representation 620 shows a signal to be output or driven to the common signal line 310 by the driver 334 of the second device 330. An abscissa 622 describes the time, and an ordinate 624 describes the signal value to be provided by the driver 334 of the second device 330. A third graphical representation 630 describes an actual signal value of the common signal line 310. An abscissa 632 describes the time, and an ordinate 634 describes the signal value.

As can be seen from FIG. 6, before a time $t_1$, both the driver 324 of the first device 320 and the driver 334 of the second device 330 are controlled to drive the same signal patterns to the common signal line 310. However, between times $t_1$ and $t_2$, the driver 324 of the first device 320 is controlled to drive a dominant value (e.g., a logical value of "0") to the common signal line 310, while the driver 334 of the second device 330 is controlled to drive a recessive value (e.g., a logical value "1") to the common signal line 310. While the value of the signal line 310 shown in the third graphical representation 630 represents the values to be driven to the common signal line 310 by both drivers 324, 334, of the first device 320 and the second device 330 before time $t_1$, the signal line 310 takes the dominant value (e.g., the logical value of "0") between times $t_1$ and $t_2$. In other words, the common signal line 310 takes the dominant value between times $t_1$ and $t_2$ even though the driver 334 of the second device 330 is controlled to drive the recessive value to the common signal line 310. After time $t_2$, the driver 334 of the second device 330 is controlled to be deactivated. For example, both the recessive value driver 570 and the dominant value driver 572 of the driver 330 may be deactivated. Consequently, after time $t_2$ the common signal line 310 takes the value driven by the driver 324 of the first device 320.

In other words, it could be said that the second device 330 "releases" the common signal line 310 by entering a high impedance (high-Z) state.

To summarize the above, the devices 320, 330, 340, 420, 430, 440, 500 may, for example, have the following capabilities:

drive a dominant value to the common signal line 310, 410, 560, for example, by activating the dominant value driver 424, 434, 444, 572;

drive a recessive value to the common signal line 310, 410, 560, for example, by deactivating the dominant value driver 424, 434, 444, 572, and by (optionally) activating the recessive value driver 570; and release the common signal line 310, 410, 560, for example, by deactivating both the dominant value driver 424, 434, 444, 572 and the recessive value driver 570; and read the status of the common signal line 310, 410, 560, for example, making use of the receivers 326, 336, 346, 526.

It should be noted that the above described functionalities can be implemented in a different way and that additional functionalities may be implemented in some embodiments. For example, driving a dominant value to the common signal line 310, 410, 560 may be performed with or without deactivating the recessive value driver 570. In addition, releasing the common signal line 310, 410, 560 may merely comprise deactivating the dominant value driver 424, 434, 444, 572. Even when the common signal line 310, 410, 560 is released by a device, the recessive value driver of the device may optionally still be active, although a current consumption may be higher than necessary in this case. In addition, the common signal line 310, 410, 560 may be reused for other purposes in some operational conditions.

In the following, a functionality will be described, which can be implemented in the devices 320, 330, 340, 420, 430, 440, 500 described with respect to FIGS. 3, 4 and 5. The functionality described in the following may, for example, be implemented in the control circuitry 230, 322, 332, 342, 422, 432, 442, 522.

Figure 7:
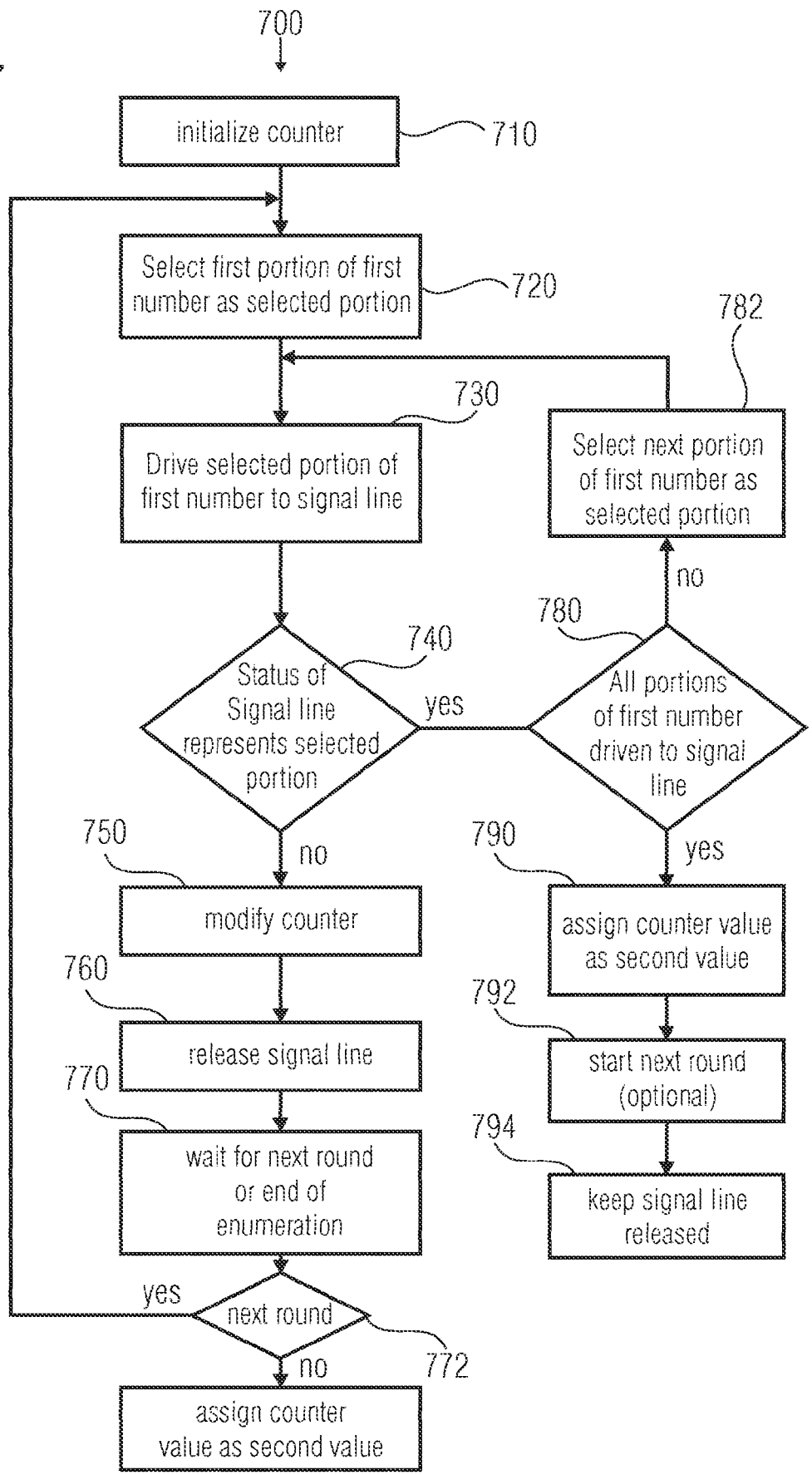
FIG. 7 shows a flow chart of a method for assigning a second number to a device on the basis of a unique first number.

FIG. 7 shows a flow chart of a method for assigning a second number to a device on the basis of a unique first number. The method of FIG. 7 is designated in its entirety with 700. In an embodiment, the method 700 may be performed in parallel in at least two devices 320, 330, 340, 410, 420, 430, 500 coupled to a common signal line. However, in a very simple embodiment, it is sufficient if the method 700 is performed in a single device connected to another device via a common signal line.

For the sake of explanation, it will subsequently be assumed that the method 700 is performed in parallel, in a time-synchronized manner, in four devices connected to a common signal line. FIG. 8 shows a graphical representation of exemplary steps, corresponding signals and intermediate results which may occur during the parallel execution of the method 700 in four devices. Taking reference to FIG. 8, a first column 810 describes the course of the execution of the method 700 for a first device. A second column 820 describes the course of the execution of the method 700 for a second device. A third column 830 and a fourth column 840 describe the course of the execution of the method 700 for a third and fourth device, respectively.

For the sake of explanation, it is assumed that a first number of binary "1001" (decimal: 9) is assigned to the first device. Moreover, it is assumed that a first number of binary "0111" (decimal: 7) is assigned to the second device. A first number of binary "1101" (decimal: 13) is assigned to the third device, and a first number of binary "0011" (decimal: 3) is assigned to the fourth device. The method 700 begins with a first step 710 of initializing a counter. The initialization of the counters to an initial value of, for example, 0 is designated in FIG. 8 with 850. In a second step 720 of the method 700, a first portion of the first number is selected as a selected portion. For example, the first device selects the most significant bit "1" of its assigned value "1001", the second device selects the most significant bit "0" of its assigned value "0111", the third device selects the most significant bit "1" of its assigned value "1101" and the fourth device selects the most significant bit "0" of its assigned value "0011". In a subsequent step 730, the devices drive the selected portion of the first number to the common signal line. Thus, the first device drives the value "1" to the common signal line, the second device drives the value "0" to the common signal line, the third device drives the value "1" to the common signal line and the fourth device drives the value "0" to the common signal line. As described above, the value "0" is assumed, for the sake of example, to be the dominant value. Thus, the signal line takes the dominant value "0", as shown in a line 852 of FIG. 8. In a fourth step 740, the devices check whether the status of the signal line represents the selected portion of the first number. As described above, the first device has driven the value "1" to the common signal line but will find that the common signal line takes the "dominant" value of "0". Consequently, the first device will decide that the status of the signal line ("0") does not represent the selected portion of the first number "1". Similarly, the third device will find that the status of the signal line does not represent the selected portion of the first number. In contrast, the second device and the fourth device will find that the status of the common signal line ("0") represents the selected portion of the first number ("0"). In response to the checking step 740, the first device and the second device will proceed with a fifth step 750 of modifying their counters. For example, the first device and the third device may increase the counters by 1, as shown in line 854 of FIG. 8. Moreover, the first device and the third device will release the common signal line according to step 760, as described above. Further, the first device and the third device will wait for a next enumeration round or for an end of the enumeration in step 770. In contrast, as the second device and the fourth device find in step 740 that the status of the common signal line represents the selected portion of the first number, the second device 820 and the fourth device 840 will proceed with step 780. In other words, the second device 820 and the fourth device 840 will check whether all portions of the first number (which are to be driven to the signal line) have been driven to the signal line. In the given example, it is assumed that the first number comprises four bits, wherein each bit may be considered to be a portion of the first number. As only one bit, the most significant bit, of the first number has been driven to the common signal line, the second device 820 and the fourth device 840 will select a next portion (e.g., the next bit after the most significant bit) as the selected portion of the first number. For the second device 820, the next selected bit is "1" (having decimal weight 4), and for the fourth device, the next selected bit is "0". The second device 820 and the fourth device 840 may proceed to step 730 to drive the respective selected portions of the first number to the common signal line. As can be seen in line 856 of FIG. 8, the second device 820 will drive the recessive value of "1" to the common signal line, and the fourth device will drive the dominant value of "0" to the common signal line. Consequently, the signal line will take the dominant value of "0" as can be seen in line 856 of FIG. 8. Thus, the second device 820 will find at step 740 that the status of the common signal line does not represent its selected portion of the first number and the second device 820 will therefore proceed to step 750. Thus, the second device 820 will, for example, increase its counter by 1, as shown in line 858 of FIG. 8. The second device 820 will proceed with steps 760 and 770. The second device 820 will release the signal line and wait for the next round of enumerations or for the end of enumeration. The fourth device 840 will find at step 740 that the status of the signal line (shown in line 856 of FIG.

8) represents its selected portion of the first number and will therefore proceed with step 780. At the present state, the first, second and third devices 810, 820, 830 have ceased to take part in the enumeration round. Consequently, only the fourth device 840 will drive to the shared signal line. Thus, the fourth device 840 will pass through steps 782, 730, 740, 780 another time, thus driving the value "1" to the common signal line. Said steps are shown in line 860 of FIG. 8. Moreover, the fourth device will once more continue to go through steps 782, 730, 740 and 780, driving the value "1" to the common signal line, as shown in line 862 of FIG. 8. When reaching step 780, the fourth device 840 will find that all portions (e.g., four bits) of the first number have been driven to the signal line. Thus, the fourth device will proceed with step 790 and assign its counter value of, for example, 0 as its second value. Subsequently, the fourth device 840 may (optionally) start a next enumeration round in step 792. During the subsequent enumeration round (within the same enumeration process), the fourth device 840 may keep the common signal line released, as shown in step 794.

Thus, a new enumeration round is started, in which the fourth device 840 does not take part. The first, second and third devices 810, 820, 830 will find in the check operation 772 that a next enumeration round has been started. Thus, the first, second and third devices 810, 820, 830 will proceed to step 720, each selecting a first portion (e.g., a most significant bit) of its first number as a selected portion. Consequently, the first device 810 will drive its selected portion, a logical value of "1", to the signal line, in step 730. The second device 820 will drive the logic value of "0" to the common signal line and the third device 830 will drive the logic value of "1" to the common signal line. Consequently, the common signal line will take the dominant logic value of "0" driven by the second device 820. The first device 810 and the third device 830 will recognize in step 740 that the status of the signal line does not represent their selected portions of the first number and will therefore increase their counters in step 750, release the common signal line in step 760 and wait for a next round or for the end of the enumeration in step 770, as shown in line 866 of FIG. 8. The second device 820 will find in step 740 that the status of the signal line ("0") represents its selected portion of the first value and will, therefore, proceed with step 780. The second device will then run through steps 782, 730 and 740 three more times, as the status of the common signal line is not affected by any other devices (devices 810, 830, and 840 have all released the common signal line)(confer lines 868, 870, 872). After the second device 820 has driven all portions of its first number to the common signal line, the second device 820 will assign its present counter value "1" as its second value in step 790 and, optionally, start a next round in step 792. In the next round of the enumeration process, the second device 820 will keep the signal line released. Subsequently, a next enumeration round will be started, wherein only the first device 810 and the third device 830 will participate. Again, the first device 810 and the third device 830 will select the first portion (e.g., the most significant bit) of their first numbers as selected portions in step 720. The first and third devices 810, 830 will then both drive the value "1" to the common signal line in step 730 (confer line 874 of FIG. 8) and find in step 740 that the status of the signal line ("1") represents their selected portions. Thus, both the first device 810 and the third device 830 will proceed through steps 780, 782 and 730. In step 730, the first device 810 will drive the value "0" to the common signal line and the third device 830 will drive the value "1" to the common signal line, as shown in line 876 of FIG. 8. The signal line will take the dominant value "0", and the third device 830 will find in step 740 that the status of the signal line does not represent its selected portion of the first value. The third device 830 will increase its counter (confer line 878 of FIG. 8), release the signal line and wait for the next round or for the end of the enumeration (steps 750, 760, and 770). The first device 810 will proceed to repeat steps 780, 782, 730, 740 and output values "0" and "1" (confer lines 880, 882 of FIG. 8). Finally, the first device 810 will proceed with steps 780, 790, 792 and 794 and assign its counter value of "2" as its second value. Subsequently, a fourth round will optionally be started. As only the third device 830 is configured to operate on the common signal line, the third device 830 will subsequently drive its selected portions of the first number to the common signal line (confer lines 884, 886, 888, 890 of FIG. 8). Finally, the third device 830 may assign its counter value of "3" as its assigned value.

It should be noted here that the method 700 can be modified substantially. For example, the initialization value of the counters can be chosen differently. Also, a different operation, other than increasing by 1, could be applied to modify the counter in step 750. For example, the counter could be decreased or modified by any other modification operation. Moreover, the counter could also be modified by a value which is different from 1. Moreover, there are different ways to select portions of the first number as the selected portions. In the given example, single bits in a subsequent order have been selected. However, other selection algorithms may be chosen. In one embodiment, even a plurality of bits may be selected in a single step. The plurality of bits could, for example, be exchanged in a parallel way, but other options are possible. Moreover, steps 750-770 could be combined into a single step. Also, the order of these steps could be changed. Moreover, a different termination criterion could be used for terminating the enumeration. For example, in an embodiment it may be sufficient to perform N−1 rounds for N devices. In this case, it may be found in step 772 that there is no further round. Subsequently, the device, which is waiting for the end of enumeration in step 770, may immediately assign its counter value as its second value when the last-but-one device has reached step 790. From the above, it can be seen that there are various possibilities to terminate the procedure, which may be more or less efficient. However, in an embodiment of the method 700, steps 720, 730, 740, 750, 760, 780 and 782 are present.

There are numerous ways to start a next round. For example, a dedicated signal or sequence of signals may be used. Alternatively, a channel synchronization mechanism or a predetermined timing may indicate a start of a subsequent round.

The method 700 can be extended by any synchronization steps to synchronize the participating devices before the beginning of the execution of the core of the method.

Figure 9:
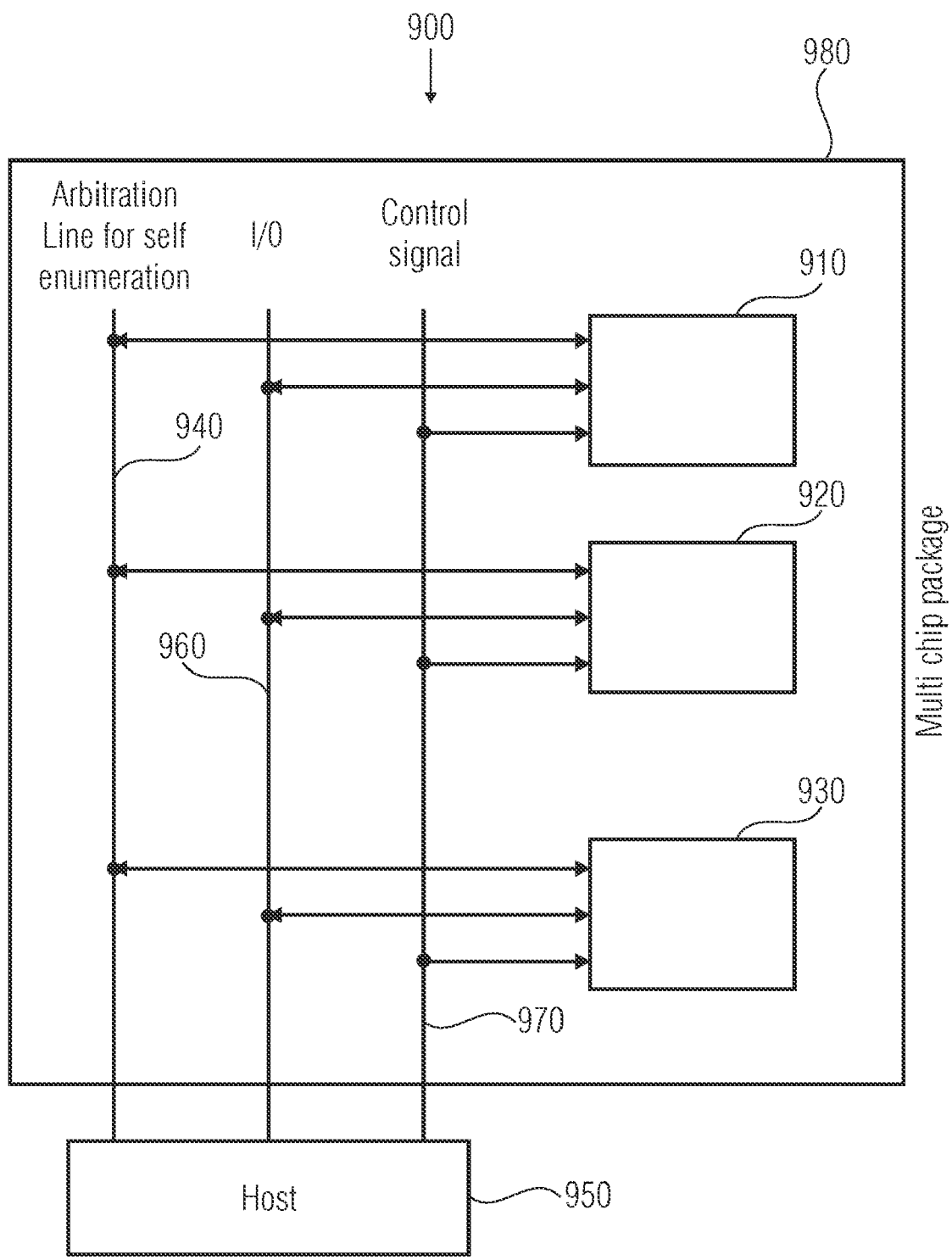
FIG. 9 shows a block schematic diagram of a system comprising a plurality of devices, according to another embodiment of the invention.

In the following, several application examples will be shown, in which the above-described concepts can be applied. FIG. 9 shows a block schematic diagram of a system comprising a plurality of devices. The system of FIG. 9 is designated in its entirety with 900. The system 900 comprises three devices 910, 920, 930, which are coupled to a common signal line 940. The common signal line 940 may, for example, be an arbitration line for a self enumeration. The devices 910, 920, 930 may, for example, each comprise a device 200, as described with reference to FIGS. 2a and 2b. Moreover, the devices 910, 920, 930 may, for example, each comprise a device 320, 330, 340, as described with reference to FIG. 3, or a device 420, 430, 440 as described with reference to FIG. 4. Alternatively, each device 910, 920, 930 may comprise a device 500, as described with reference to FIG. 5. In another embodiment, each device 910, 920, 930 may be configured to perform the method 700 as described with respect to FIG. 7. However, in some embodiments it is sufficient if only one of the devices 910, 920, 930 comprises the functionality that is described with reference to FIG. 2, 3, 4, 5 or 7.

The system 900 may, optionally, comprise a host 950, which may, for example, comprise a functionality of a processor or of a memory controller. In an embodiment, the devices 910, 920, 930 are coupled with the host 950 via the common signal line or arbitration line 940. It should be noted here that the common signal line or arbitration line 940 may serve both for a self enumeration of the devices 910, 920, 930 (e.g., in an initialization phase) and for a communication between the host 950 and the devices 910, 920, 930. The devices 910, 920, 930 may additionally be coupled to the host 950 via additional lines. For example, an input/output (I/O) line 960 may be present. The input/output line 960 may, for example, serve as a bi-directional bus between the host 950 and the devices 910, 920, 930. For example, if the devices 910, 920, 930 are NAND memory devices, the input/output lines 960 may serve as a NAND data-command bus. Moreover, one or more control signals 970 may be present in the system 900. The devices 910, 920, 930 may, for example, be coupled with the host 950 via the control signals 970. In an embodiment, the control signals 970 may provide a unidirectional communication from the host 950 to the devices 910, 920, 930.

In an embodiment, the devices 910, 920, 930 may be chips, which may be connected via the common signal line 940, the input/output lines 960 and the control signals 970 with the host 950. Moreover, in the case of the devices 910, 920, 930, being separate chips, the devices 910, 920, 930 may be comprised in a multichip package 980. In other words, the common signal line 940, the input/output line 960 and the control signal 970 may be routed within the multichip package 980 in an embodiment.

Figure 10:
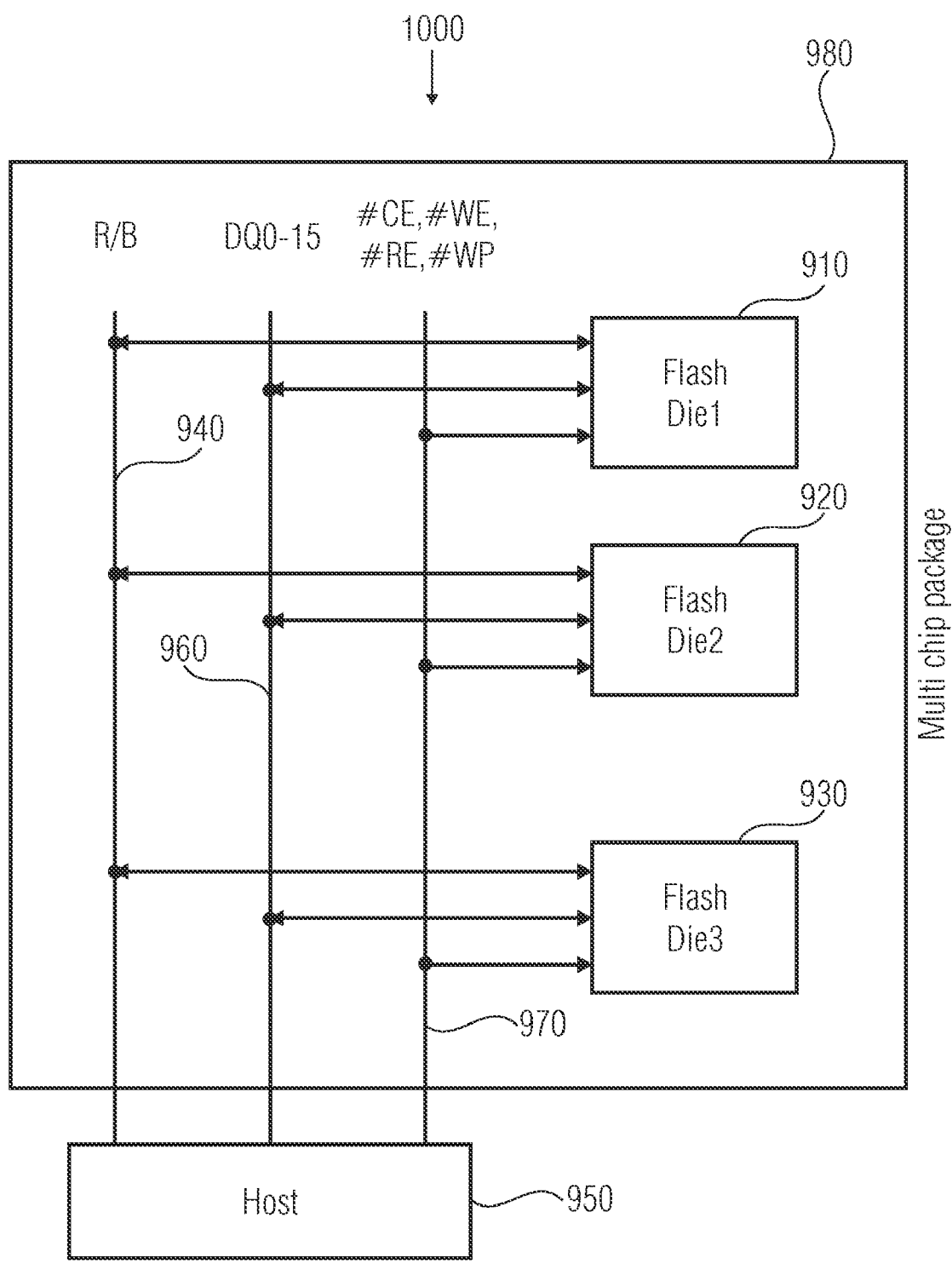
FIG. 10 shows a block schematic diagram of a system comprising a plurality of devices, according to another embodiment of the invention.

In the following, another embodiment will be described. FIG. 10 shows a block schematic diagram of a system according to another embodiment of the invention. The system of FIG. 10 is similar to the system shown in FIG. 9. Therefore, identical means and signals will be designated with identical reference numerals. As can be seen from FIG. 10, the system 900 can, for example, be applied for an enumeration of NAND flash chips. In the system 1000, the devices 910, 920, 930 may comprise flash dies. In the system 1000, the common signal line 940 may be a ready/busy line. In other words, the common signal line 940 of the system 1000 may be used as a ready/busy line in a normal operation and, in addition, may be used as an enumeration line during the enumeration procedure. Moreover, in the system 1000, the input/output line 960 may comprise one or more (e.g., 16) data lines DQ0 to DQ15. The control signals 970 may comprise signal lines for a chip enable signal (chip enable #CE), a write enable signal (#WE), a read enable signal (#RE) and a write protect signal (#WP).

To summarize the above, the concept described here may be suitable for a NAND multichip package or NAND-flash multichip package.

The ready/busy line (R/B line) can be used as an arbitration line if an input port and a small transistor connected to a supply voltage (to the supply voltage VCC) is implemented in the R/B line (or coupled to the R/B line). In some embodiments, the R/B line has more relaxed requirements in terms of speed and capacity (e.g., when compared to some other lines of the memory chip, like the data lines DQ or the control signals).

In the following, some further aspects of the present concept will be described. According to some embodiments of the invention, it is desired to perform an enumeration of devices (e.g., of different integrated circuits or memory chips) with little or no interaction with the host. In an embodiment, a set of dies can start an enumeration procedure or self-assignment procedure without a starting signal of a host. Rather, a set of dies can start the enumeration procedure or self-assignment procedure when the power supply reaches a trigger voltage. However, there are some cases in which it is not possible to have a sufficiently synchronized start up of the self-enumeration after the power-up. This may, for example, be the case if it is not possible, or too expensive, to implement a (sufficiently accurate) detection circuit for the threshold voltage. This may also be the case if the time required to start-up the self-enumeration procedure varies too much from one integrated circuit to another integrated circuit. In these cases, it may be desirable to implement a synchronization procedure or to use a sufficiently long unique ID.

In an embodiment the synchronization for a plurality of chips can, for example, be implemented using a trigger voltage. Alternatively, or additionally, a sufficiently long ID can be used, in order to ensure a correct self-enumeration. Alternatively (or additionally) a synchronization sequence can be used to trigger the start of the self-enumeration procedure.

Regarding the usage of a sufficiently long ID, it may be assumed that MAX_TIME is a maximum expected difference in a procedure start up time among all the integrated circuits (ICs). In an embodiment, a length of a unique ID of the integrated circuit is chosen to be long enough, so that a number of bits transmitted after the time MAX_TIME (measured, for example, from power-up) is long enough to guarantee that every integrated circuit (involved in the self-enumeration) transmits a different number. In this way, it is possible to ensure a correct self-enumeration.

In the following, it will be described how a synchronization sequence can be used for synchronizing a plurality of chips, for example for a self-enumeration. If, for example, it is not possible to provide a long enough unique ID, it may be desirable to transmit a synchronization sequence of bits. In the following, a possible implementation of a synchronization procedure will be described. Here, it is assumed that a plurality of integrated circuits (ICs) is coupled to a synchronization line. In an embodiment, all integrated circuits after power-on, if they do not detect any activity on the synchronization line, start to transmit a sequence of "10110 . . . ," long enough to ensure that all integrated circuits have started sending the sequence.

During the transmission of the synchronization sequence, all integrated circuits may monitor the line. If one of the integrated circuits detects a conflict, the integrated circuit that detects the conflict stops to transmit the sequence, but continues to monitor toward the synchronization line. This may avoid a disturbance of the synchronization line. The first integrated circuit that completes the sending of the synchronization sequence (e.g., after having sent a predetermined number of synchronization sequences or hits) starts to send, for example, 2 or more dominant bits or dominant values. The two or more dominant bits or dominant values may, for example, form a start sequence. In the case of a NAND operation (or wired-AND-operation), the dominant bits may be "0". The end of the start sequence may trigger the start of the self-enumeration for all integrated circuits that are monitoring the synchronization line.

In the following, details regarding the generation of a dominant bit (or a dominant value) and a recessive bit (or recessive value) on a common signal line will be described. For example, if a signal line is used in order to perform the self-enumeration, it is desirable to have one dominant value (also designated as a dominant bit) and one recessive value (also designated as a recessive bit) on the common signal line (e.g., on the arbitration line). For example, the driver of the dominant value, or dominant bit, may be stronger than the sum of all drivers of recessive values (or recessive bits) present on the bus.

For example, the dominant value (or dominant bit) may be "0", and the recessive value (or recessive bit) may be "1". For example, the "0" and "1" designate logic values, which may be represented by corresponding signal values (e.g., potentials).

However, another definition of dominant and recessive values is possible in the above case. If one device outputs the value "0" on the line (also designated as the common signal line) and all other devices drive the value "1", the reading of the line may still output the value "0".

In an embodiment, if the system is designed such that N devices are supposed to participate in an enumeration, a dominant driver coupled to a common signal line is preferably designed such that the common signal line takes the dominant value if only one dominant value driver of the N devices coupled to the signal line is active, and if N−1 recessive value drivers coupled to the common signal line are active.

In the following, an enumeration procedure according to an embodiment of the invention will briefly be summarized. In an embodiment, a unique number (also designated as a unique first number or "first number") is stored in every device which is designed to participate in the self enumeration. In an embodiment, a unique number may be stored in every device (or at least in a plurality of devices) at wafer level test. However, the unique number can be stored at any other device processing step.

For example, the unique number may already be provided in a lithography mask or any other means for producing the semiconductor structure of the device. Thus, the unique number may, for example, be stored in a read-only memory of the device. Alternatively, the unique number may be stored in a write-once-read-multiple (WORM) memory of the device. For example, the unique number may be stored in a PROM structure of the device, an EPROM structure of the device, an EEPROM structure of the device or a FLASH memory structure device. However, other non-volatile or even volatile memory structures may be used to store the unique number or "first number".

The unique number may for example be unique for all dies of the same type produced by the same company. However, other possibilities are possible. For example, the unique number may be unique for a set of chips produced on a single wafer. According to an embodiment of the invention, it is sufficient if the unique number is unique among chips coupled to form a self-enumeration group, i.e., a group of chips in contact with each other for the purpose of performing a self-enumeration.

In an alternative embodiment, the unique number (or first number) may be generated by a random number generator integrated into the device. A random number may, for example, be generated when powering up the device.

However, in another embodiment, a unique identifier may also be provided to the device externally, for example, by an external unique number provider.

In the above description, it has been supposed that the dominant value (or dominant bit) in the arbitration line is "0". However, the present concept is naturally also applicable if the dominant value or dominant bit of the arbitration line is, for example, "1".

Moreover, the present concept is also applicable in a case where more than two states of the arbitration line are defined. In this case, one state (e.g., represented by a potential) may be used as the dominant value.

In some embodiments, after packaging a device (or an integrated circuit) in a multi-chip enclosure, it is desired to assign a further ID number (also designated as a second number) to the device or integrated circuit. It should be noted here that in principle it would be possible to address a single die (or a device or an integrated circuit) using the unique ID number (first number). However, a unique ID number in many cases is too long and could, for example, be 8-16 bytes long. In some applications, it is desirable to use a usual communication protocol (e.g., "multi-chip NAND FLASH"), which uses specific commands to address several dies (designated for example, as "DIE1", "DIE2"). For example, the operation "CMD 0xF1" is used to read the status register for a first die or first chip (chip1). The operation "CMD 0xF2" may, for example, be used to read a status register of a second die or second chip (chip2). In view of the above standard commands, which may be used for addressing different dies, it is typically desired to assign a short and progressive number to all chips (or dies) within a package or multi-chip package. In other words, it is sometimes desired to have a minimum number of representative bits.

After powering up a multi-chip packaging (MCP), a proper sequence of signals may be issued by an external host to initiate the self-enumeration sequence. However, the self-enumeration sequence may alternatively be triggered without interaction with a host, as it has been described above.

Subsequently, all devices may start to output the unique number serially to the arbitration lines and at the same time monitor the status of the arbitration line (also designated as a "common signal line").

If one device verifies a difference between the bit that it would like to output and the status of the arbitration line, the device may stop the drive of the arbitration signal or the arbitration line. This functionality has been described taking reference to FIG. 6. At time $t_1$, the second device (device B) would like to drive a value of "1" to the arbitration line, but the arbitration line is dominated by the value of "0" driven to the arbitration line by the first device (device A). So there is a conflict between values driven by the first device (device A) and the second device (device B). However, the value of "0" "wins, because the value "0" is the dominant value or dominant bit. Consequently, the "looser device" (i.e., the second device, device B, which drives the recessive value "1" to the common signal line) puts the common signal line (for its driver is coupled to the common signal line) into a high-impedance (high-Z) state.

Only one device will end the output of a full unique number, and will for example be the one with the lowest unique number. This device can for example be called the "winner device".

A number of conflicts detected by the winner device that has completed the sequence may be stored, and it may be the ID number (or second number) of this device.

Before going to the inactive mode (in which the device may, for example, keep all output lines in a high-impedance or high-Z state), the winner device may signal to all other devices to start the sequence again. This signaling could be done in many different ways: for example, a special sequence on the arbitration line could be used to start again the sequence or enumeration sequence (for example a new round of the enumeration sequence). Alternatively (or in addition), other data lines or control lines could be used to signal to the other devices to start the sequence again.

The procedure may be repeated, for example, until no activities will detected on the arbitration line, and so the external host can remove the power or proceed with other actions.

As a final result, all devices (participating in the self-enumeration) will self-enumerate themselves with progressive different numbers. The procedure can be repeated. When repeating the procedure, the same ID assignment may always be obtained.

Regarding the circuit 500 of FIG. 5, it should be noted that the transistor circuited between the coupling node 550 and the supply potential VCC (also designated as a "bit 1 transistor") should be carefully designed. In the following, it is assumed that several of the devices 500 may be coupled to a common signal line, for example to a ready/busy line (R/B line). For example, when all "bit 1 transistors" (less one) on the read/busy signal (R/B signal) are active and only one "bit 0 transistor" (circuited between the coupling mode 550 and the reference potential GND) is active, the signal present on the ready/busy line must be read "0". In an embodiment, a level which is present on the ready/busy line when the recessive value drivers 570 of all the devices, except for one device, are active, and when only a single dominant value driver 572 is active, must be such that the receiver circuit 526 reliably detects this level as a level representing the dominant value.

With reference to the device 500 of FIG. 5, it should be noted that a simple device may comprise the dominant value driver 572. Thus, starting from a simple device having a ready/busy line, it may be sufficient to add the recessive value driver 570, the receiver circuit 526 and the control circuit 522 in order to implement a self-enumeration mechanism. In an embodiment, the circuit part designated with 590 may be coupled with the ready/busy signal, which may be present in a NAND memory.

The driver circuit 524, the receiver circuit 526 and the control circuit 522 may for example all be implemented on the flash die.

In the following, some further aspects of some embodiments of the present invention will be described. For some types of devices like NAND-flash memories, the concepts and methods described herein can be implemented with a minimum effort.

The arbitration line can be implemented making use of the ready/busy signal line without adding any extra pads and without any compromise of performance.

In come cases, a unique ID (e.g., a first number) is already stored (in a device or in an integrated circuit) at wafer sorting.

In some embodiments, host overhead is minimum. In some embodiments, a host only needs to start the sequence. In some other embodiments, the self-enumeration is even started without host action.

In some embodiments, where a unique ID stored on the chip during testing is evaluated, it may be guaranteed that every time the procedure is applied, the same die-ID number association will be created. However, it is also possible to create the unique number (or first number) through a random number generator.

Some embodiments of the invention can be used for an enumeration of flash dies inside a multi-chip package.

Some embodiments of the invention can be used in combination with present and future high-density multi-chip devices. In such devices, it is sometimes required to have all electrical signals connected to all chips, so that it is not possible to select a single die using an electrical signal (e.g., a separate chip select signal "#CE"). Dies may for example be selected by using commands and/or addressing that will be recognized by the chip. For example, in a NAND-flash memory, a chip will be selected by a last bit of a last address cycle. To achieve this, and to avoid a conflict, it is sometimes desired that every die in a package has a unique ID number that differs from the ID numbers of all other dies in the same package. In some cases, it is desired that the unique ID uses a minimum number of bits. For example, for a 16-die stack, only four bits are required. Moreover, it is sometimes desired that the unique ID be progressive. Some embodiments described herein provide the possibility to assign this ID without adding any extra pad and without (significantly) increasing the complexity of the device.

Some embodiments of the invention may eliminate the need to designate the device inside a stacked device by making use of bonding options or adding pads. Some embodiments described herein are suitable for NAND-flash devices. However, some embodiments described herein can also be applied to other devices.

Under certain circumstances, it may be required to add one pad (or even several pads) to a conventional device when implementing the concept described herein.

Some embodiments of the invention can be summarized as follows:

Dies inside a multi-chip package may self-enumerate themselves with minimum effort of an external host. Some embodiments comprise a circuit or a procedure in order to enable a self-enumeration of every die by using an arbitration line. On this arbitration line, all the chips (or dies) may communicate in order to self assign a unique (only inside the package) progressive number. After an arbitration phase, the same signal can be used for normal activities.

For some types of devices like NAND-flash, this method can be implemented with a minimum of effort. The arbitration line (or common signal line) can be implemented in the ready/busy signal (R/B signal) without adding any extra pads and without any performance being compromised.

In some cases, a unique ID (or first number) is already stored at wafer sorting.

In some embodiments, host overhead may be minimal. In some embodiments, the host may only be required to start the sequence. In other embodiments, there may be no need for any host interaction in order to perform the self-enumeration.

Some embodiments, in which a unique ID stored in a non-volatile memory is used, may guarantee that every time the procedure is applied, the same die-ID number association will be created. However, there are some embodiments in which a unique number may be generated by a random number generator.

In some embodiments, the following specific methodology and related circuit is applied to the self-numeration of a set of chips inside a multi-chip package:

Dominant and recessive bit;

Self-enumeration process.

The above-described invention may be implemented in combination with the multi-chip device that contains a flash-NAND die. Using the ready/busy (R/B) signal (which may be present in a flash-NAND memory) is particularly suitable for this methodology.

Some embodiments of the invention can be used in the design of a new generation of NAND-flash devices in order to support a multi-chip design.

In some embodiments, a random number may be used as a predetermined number or unique number (or first number). This solution may be used if a non-volatile unique ID is not available on a die.

In some embodiments, the self-enumeration procedure may be started with the help of a host or device controller. Such an implementation may be used when the self-enumeration should be performed at every start-up, and if the host is not adapted to start the sequence. For example, there may be systems where it is not possible to modify the host for starting the self-numeration procedure. Some embodiments have been described above as to how the self-enumeration can be started without the help of the host.

Some embodiments of the invention provide a method to address dies, which are connected in parallel sharing the same signal. In some embodiments, this may be done using a methodology similar to the one utilized in communication systems. Some embodiments of the invention may be used for multi-die stacks, which is a new frontier in memory modules. Some embodiments of the invention have a very limited impact on existing signals or systems and can easily be implemented in already available designs.

Some embodiments of the invention can be used in present and future applications to identify multi-chip devices. In some present and future applications, it is desired to have only one chip enable (#CE) signal. A single die may be addressed through the decoding of an address. To achieve this and to avoid conflict, it may be desirable that every die in the package has a unique ID number that differs from all other dies in the same package. Some embodiments of the invention provide a method to enable a certain enumeration of all dies without adding any extra pad and without modifying an existing multi-chip package project.

What is claimed is:

1. A method for enumeration by assigning a second number to a device of a plurality of devices, each device of the plurality of devices having a different unique first number, the method comprising:
   comparing at least portions of the first numbers by successively comparing at least portions of first numbers of devices passing a preceding comparison until one device remains, wherein the second number is assigned to the one device that remains;
   assigning the second number to one of the plurality of devices depending on the result of the comparison; and
   counting a count of comparisons a device has not passed and assigning the second number based on the count.

2. The method according to claim 1, wherein different portions of the first numbers are compared in subsequent comparisons.

3. The method according to claim 1, wherein the first numbers comprise an order of binary digits and wherein, when successively comparing, different binary digits are compared according to the order.

4. The method according to claim 1, further comprising repeating comparing and assigning for such devices to which the second number has not been assigned.

5. A method for enumeration by assigning a second number to a device of a plurality of devices, each device of the plurality of devices having a different unique first number, the method comprising:
   comparing at least portions of the first numbers by providing signals indicative of the at least portions of the first numbers to a signal line and detecting the state of the signal line, wherein the signal line is capable of acquiring different states, the states comprising at least a first state and a second state, wherein the signal line comprises the first state when at least one signal provided to the signal line corresponds to the first state, and wherein the signal line comprises the second state when all signals provided to the signal line correspond to the second state; and
   assigning the second number to one of the plurality of devices depending on the result of the comparison.

6. The method according to claim 1, further comprising assigning the different unique first numbers to the devices of the plurality of devices.

7. The method according to claim 1, wherein the different unique first numbers comprise at least one of a device-specific number, a serial number, an identifier indicative of the type of the device, an identifier indicative of a manufacturer of the device, a wafer number, a position of the device on the wafer, a random number, a pseudo-random number and/or a predetermined number.

8. The method according to claim 1, wherein the second number is shorter than the first number.

9. The method according to claim 1, wherein the second number comprises a minimum length required to enable different second numbers to be assigned to each of the devices of the plurality of devices.

10. The method according to claim 1, further comprising receiving a trigger signal or a power supply signal, wherein comparing at least portions of the first numbers is initiated upon receipt of the trigger signal or the power supply signal.

11. The method according to claim 1, wherein the comparing and assigning are performed by the plurality of devices.

12. The method according to claim 1, wherein each of the devices of the plurality of devices comprises an integrated circuit, a memory device or a memory circuit.

13. A method for enumeration by assigning a second number to a device having a different first number with respect to a further device, the method comprising:
   providing at least one binary digit of the different first number to a signal line coupled to the device and, for each provided binary digit, detecting a state of the signal line, wherein the signal line is capable of acquiring different states, the states comprising at least a first state and a second state, wherein the signal line comprises the first state when at least one signal provided to the signal line corresponds to the first state, and wherein the signal line comprises the second state when all signals provided to the signal line correspond to the second state;
   comparing the state of the signal line and the provided binary digit; and
   assigning the second number to the device based on the result of the comparison of the state of the signal line and the provided binary digit.

14. A method for enumeration by assigning a second number to a device having a different first number with respect to a further device, the method comprising:
   successively providing at least one binary digit of the first number to a signal line coupled to the device and, for each provided binary digit, successively detecting a state of the signal line when the device passes the preceding comparison until one device remains, wherein the signal line is capable of acquiring different states, the states comprising at least a first state and a second state, wherein the signal line comprises the first state when at least one signal provided to the signal line corresponds to the first state, and wherein the signal line comprises the second state when all signals provided to the signal line correspond to the second state;
   successively comparing the state of the signal line and the provided binary digit when the device passes the preceding comparison until one device remains;
   counting a count of comparisons a device has not passed; and
   assigning the second number to the device based on the count and based on the result of the comparison of the state of the signal line and the provided binary digit when the device is the one device that remains coupled to the signal line.

15. A device for enumeration by assigning a second number to the device, the device comprising:
   a first storage position storing a first number;
   a second storage position storing the second number;
   circuitry coupled to the first storage position and the second storage position, the circuitry comparing at least a portion of the first number with a portion of a different first number associated with another device and assigning a second number to the device based on a result of the comparison and comparing at least portions of first numbers of devices passing a preceding comparison until one device remains, and assigning the second number to the device, when the device is the one device that remains; and
   a counter that determines a count of comparisons a device has not passed, wherein the circuitry assigns the second number based on the count.

16. The device according to claim 15, wherein the circuitry compares different portions of the first numbers in subsequent comparisons.

17. The device according to claim 15, wherein the circuitry is adapted such that comparing at least a portion of the first number with at least a portion of a different first number is repeated until the second number has been assigned to the device.

18. A device for enumeration by assigning a second number to the device, the device comprising:
   a first storage position storing a first number;
   a second storage position storing the second number;
   circuitry coupled to the first storage position and the second storage position, the circuitry comparing at least a portion of the first number with a portion of a different first number associated with another device and assigning a second number to the device based on a result of the comparison; and
   a driver circuit to be coupled to a signal line and to provide signals indicative of the portions of the first number to the signal line and to detect a state of the signal line for each provided portion of the first number, wherein the signal line is capable of acquiring different states, the states comprising at least a first state and a second state, wherein the signal line comprises the first state when at least one signal provided to the signal line corresponds to the first state, and wherein the signal line comprises the second state when all signals provided to the signal line correspond to the second state, and wherein the circuitry is adapted to compare the state of the signal line with at least the corresponding provided portion of the first number.

19. The device according to claim 15, further comprising further circuitry to assign the first number to the device.

20. The device according to claim 15, wherein the first number comprises at least one of a device-specific number, a serial number, an identifier indicative of the type of the device, an identifier indicative of a manufacturer of the device, a wafer number, a position of the device on the wafer, a random number, a pseudo-random number, a predetermined number and/or a unique number.

21. The device according to claim 15, wherein the second number is shorter than the first number.

22. The device according to claim 15, wherein the second number comprises a minimum length required to enable different second numbers to be assigned to each of the other devices.

23. The device according to claim 15, wherein the device receives a trigger signal and/or a power supply signal, wherein the circuitry initiates comparing at least a portion of the first number with at least a portion of a different first number associated with another device upon receipt of the trigger signal or the power supply signal.

24. The device according to claim 15, wherein the device comprises an integrated circuit.

* * * * *